United States Patent [19]
Hamade et al.

[11] Patent Number: 5,323,349
[45] Date of Patent: Jun. 21, 1994

[54] DYNAMIC SEMICONDUCTOR MEMORY DEVICE HAVING SEPARATE READ AND WRITE DATA BASES

[75] Inventors: Kei Hamade; Shigeru Mori, both of Hyogo, Japan

[73] Assignee: Mitsubishi Denki Kabushiki Kaisha, Tokyo, Japan

[21] Appl. No.: 936,454

[22] Filed: Aug. 28, 1992

[30] Foreign Application Priority Data

Oct. 31, 1991 [JP] Japan .................. 3-286351

[51] Int. Cl.[5] .................. G11C 7/00; G11C 11/40
[52] U.S. Cl. .................. 365/207; 365/149; 365/189.01
[58] Field of Search ............... 365/207, 205, 182, 149, 365/189.01

[56] References Cited

U.S. PATENT DOCUMENTS

| | | | |
|---|---|---|---|
| 4,085,457 | 4/1978 | Itoh | 365/205 |
| 4,479,202 | 10/1984 | Uchida | 365/190 |
| 4,819,207 | 4/1989 | Sakui et al. | 365/207 |
| 4,819,212 | 4/1989 | Nakai et al. | 365/207 |
| 4,879,682 | 11/1989 | Engles | 365/207 |
| 4,931,994 | 6/1990 | Matsui et al. | 365/207 |
| 4,954,992 | 9/1990 | Kumanoya et al. | 365/207 |
| 4,984,206 | 1/1991 | Komatsu et al. | 365/208 |
| 5,023,841 | 6/1991 | Akrout et al. | 365/207 |
| 5,083,295 | 1/1992 | Lammerts et al. | 365/207 |
| 5,172,340 | 12/1992 | Leforestier et al. | 365/207 |

FOREIGN PATENT DOCUMENTS 1-169798 7/1989 Japan .................. 365/207

Primary Examiner—Eugene R. LaRoche
Assistant Examiner—Dinh Son
Attorney, Agent, or Firm—Lowe, Price, LeBlanc & Becker

[57] ABSTRACT

Separated IO type dynamic memory device includes a write data bus for transmitting data to be written into a selected memory cell and a read data bus for transferring data read out from a selected memory cell. The write data bus and the read data bus are separately provided from each other. The memory device further includes a load circuit for supplying a current flow to the read data bus and for precharging the read data bus to a predetermined potential, and drive circuits provided for each pair of bit lines each connecting memory cells of a column for driving the read data bus to a potential corresponding to potentials appearing on an associated pair of bit lines in response to a column select signal. The memory device further includes an insulated gate type transistor inserted on the read data bus between the loading circuit and the driving circuits and receives a predetermined intermediate potential at the gate. An output node for supplying an output data is provided between the insulated gate type transistor and the load circuit. This enables fast discharging of the read data bus at the output node, resulting in a high speed data reading operation.

11 Claims, 8 Drawing Sheets (A) (INVENTION)

(B) (PRIOR ART)

DYNAMIC SEMICONDUCTOR MEMORY DEVICE HAVING SEPARATE READ AND WRITE DATA BASES

FIELD OF THE INVENTION

1. Field of the Invention

The invention relates to a semiconductor memory device, and particularly to a semiconductor memory device implementing a high speed reading operation. More particularly, the invention relates to an improvement of a semiconductor memory device of a separated IO type in which data read lines and data write lines are provided independently and separately.

2. Description of the Related Art

In recent years, various constructions have been proposed for implementing a high speed operation of semiconductor memory devices. As one of these attempts for the high speed operation, there is a construction in which read data lines for transmitting read data and write data lines for transmitting write data are provided independently and separately. Such semiconductor memory device is called a semiconductor memory device of a separated IO type. The semiconductor memory device of the separated IO type operates, in the data reading operation, to drive a read only amplifying means for transmitting data of a selected memory cell to a read data line, before the operation of a sense amplifier of a latch type. This enables data to be read immediately after selection of a word line.

FIG. 7 shows a memory cell array and related peripheral circuits of a conventional semiconductor memory device of the separated IO type. The structure of the semiconductor memory device of the separated IO type shown in FIG. 7 is disclosed, e.g., in the Japanese Patent Laying-Open No. 1-169798. FIG. 7 representatively shows a construction of a pair of bit lines BL and /BL related to memory cells in one column of the memory cell array.

In FIG. 7, bit lines BL and /BL provides a folded bit line structure. Memory cell 1 is disposed at a position corresponding to a crossing of a word line WL and bit line BL. Memory cell 1 includes a capacitor C0 for storing information and a transfer gate Q0 which is turned on to connect capacitor C0 to bit line BL in response to a signal potential on word line WL.

For bit line pair BL and /BL, there are provided an N-type sense amplifier 2, which operates in response to a sense amplifier drive signal applied to a signal line 41 to discharge a potential of one bit line having a lower potential in bit line pair BL and /BL to a ground potential level, a P-type sense amplifier 3 which operates in response to a sense amplifier drive signal applied to a signal line 51 to raise the potential of the bit line having a higher potential in bit line pair BL and /BL to a supply potential Vcc level, and a precharging/equalizing circuit 6 for precharging and equalizing the potentials of bit lines BL and /BL to a predetermined potential.

N-type sense amplifier 2 includes cross-coupled n-channel MOS transistors (insulated gate type field effect transistors) Q1 and Q2. Transistor Q1 has a source connected to signal line 41, a gate connected to bit line BL and a drain connected to bit line /BL. Transistor Q2 has a source connected to signal line 41, a gate connected to bit line /BL and a drain connected to bit line BL.

P-type sense amplifier 3 includes cross-coupled p-channel MOS transistors Q3 and Q4. Transistor Q3 has a source connected to signal line 51, a gate connected to bit line BL, and a drain connected to bit line /BL. Transistor Q4 has a source connected to signal line 51, a gate connected to bit line /BL, and a drain connected to bit line BL.

Precharging/equalizing circuit 6 includes an equalizing transistor Q7 which is responsive to an equalizing signal EQ to electrically short-circuit bit lines BL and /BL, and precharging transistors Q8 and Q9 which are responsive to equalizing signal EQ to supply a predetermined precharge potential VBL to bit lines BL and BL. Transistors Q7, Q8 and Q9 each are formed of n-channel MOS transistor.

The sense amplifier drive signal for driving N-type sense amplifier 2 is generated by an N-type sense amplifier activating circuit 4 formed of an n-channel MOS transistor Q5, which is responsive to a sense amplifier activating signal S0 to connect signal line 41 to ground potential. The sense amplifier drive signal for driving P-type sense amplifier 3 is generated by a P-type sense amplifier activating circuit 5 formed of a p-channel MOS transistor Q6, which is responsive to a complementary sense amplifier activating signal /S0 to connect signal line 51 to supply potential Vcc.

For writing and reading data to and from bit lines BL and /BL, there are provided n-channel MOS transistors Q10 and Q11 which become conductive in response to a column selecting signal Yi supplied from a column decoder (not shown), n-channel MOS transistors Q12 and Q13 which are turned on in response to a write instructing signal, and a sense amplifier 7 of a current mirror type which is activated, in data reading operation, in response to column selecting signal Yi to differentially amplify the potentials of bit lines BL and /BL.

Transistors Q10-Q13 connect bit lines BL and /BL to write only data lines WI and /WI which transmit a write data, when the bit lines BL and /BL are selected by column selecting signal Yi in the data writing operation.

Sense amplifier 7 of the current mirror type has an internal node formed of a read only data line pair, RI and /RI, transmitting a read data and includes a load circuit 7a supplying a current flow to read only data line pair RI and /RI, and a drive circuit 7b which is provided for bit line pair BL and /BL and differentially amplifies and then transmits the potentials of bit line pair, BL and /BL, to read only data line pair RI and /RI.

Load circuit 7a includes a p-channel MOS transistor Q14 disposed between supply potential Vcc and read only data line RI, and a p-channel MOS transistor Q15 disposed between supply potential Vcc and read only data line /RI. The potential of a node N02 of read only data line /RI is fed back to gates of transistors Q14 and Q15. Read only data line RI transmits the read data through its node N01 to a preamplifier or other circuit in a next stage. Load circuit 7a forms a current mirror circuit and thus supplies the same amount of current flow to read only data lines RI and /RI.

Drive circuit 7b includes an n-channel MOS transistor Q16 of which gate is connected to bit line BL, n-channel MOS transistor Q17 of which gate is connected to bit line/BL, and n-channel MOS transistors Q18 and Q19 which are responsive to column selecting signal Yi to connect one conduction terminal of transistor Q16 and one conduction terminal of transistor Q17 to the ground potential, respectively. The other conduction terminals of transistors Q16 and Q17 are connected to read only data lines /RI or RI, respectively. Structures similar to those provided for bit lines BL and /BL described above are provided for each bit line pair, which is represented only by a block indicated by a broken line in FIG. 7. Drive circuits 7b provided for the respective bit line pairs are commonly coupled to read only data line pair RI and /RI.

In the construction shown in FIG. 7, data is read and written through different paths. The data is written through write only data line pair WI and /WI and transistors Q10-Q13. Meanwhile, the data is read through drive circuit 7b, read only data line pair RI and /RI, and load circuit 7. Now, an operation of the semiconductor memory device shown in FIG. 7 will be described with reference to an operation waveform diagram of FIG. 8. In FIG. 8, the same reference characters as those in FIG. 7 indicate waveforms of corresponding signals.

First, a read operation will be described below. As an example, it is assumed that memory cell 1 has stored information "1" in the following description of the operation. Initially, a write instructing signal W is at a low level. Transistors Q12 and Q13 are in the off-state, and write only data line pair, WI and /WI, is isolated from each bit line pair.

Before time T1, equalizing signal EQ is at a high level, and all transistors Q7-Q9 of the precharging/equalizing circuit are in the off-state. Thereby, bit lines BL and /BL are precharged and equalized to predetermined precharge potential VBL.

Meanwhile, read only data line pair RI and /RI is stable at a predetermined stable potential (Vcc−|Vthp|) due to load circuit 7a. Vcc indicates an operating power supply potential and Vthp indicates threshold voltages of transistors Q14 and Q15.

At time T1, equalizing signal EQ lowers from the high level to the low level, whereby all transistors Q7-Q9 contained in precharging/equalizing circuit 6 are turned off, and each of bit lines BL and /BL is brought into a floating state at the precharged potential.

At time T2, a word line selecting circuit (not shown) such as a row decoder selects the word line WL in response to an externally applied address signal. When the potential of selected word line WL rises from the low level to the high level, transfer gate transistor Q0 in memory cell 1 is turned on. Since memory cell 1 has stored information "1", the potential of bit line BL slightly rises as indicated by solid line in FIG. 8. Since the other bit line /BL is not connected to a memory cell, it maintains the precharged potential.

At time T3, column decoder (not shown) and others perform column selecting operation in accordance with an external column address signal, and column selecting signal Yi rises from the low level to the high level. In response to column selecting signal Yi, transistors Q18 and Q19 are turned on. Thereby, amplifier 7 of the current mirror type formed of transistors Q14-Q19 is activated. That is; after the potential of word line WL changes from the low level to the high level at time T2 and the signal potential on bit line BL slightly rises, amplifier 7 of the current mirror type is activated at time T3.

The potential of bit line BL is slightly higher than that of bit line /BL, so that the conductance of transistor Q16 becomes larger than that of transistor Q17. Transistors Q14 and Q15 in load circuit 7a supply the same amount of a current flow to read only data lines RI and /RI. A discharging path formed of transistors Q16 and Q18 allows a flow of the current to the ground potential at a higher speed than a discharging path formed of transistors Q17 and Q19. Therefore, the potential of read only data line /RI falls at a higher speed than the potential of read only data line RI. Thus, amplifier 7 of the current mirror type amplifies a minute potential difference between bit lines BL and /BL at a high speed, for transmission to read only data lines /RI and RI. The potentials of read only data lines RI and /RI are supplied through node NOl to, e.g., an input of an amplifier such as a preamplifier in the next stage.

Thereafter, at time T4, sense amplifier activating signals S0 and /S0 enter the active state, i.e., the high level and low level, respectively, so that transistors Q5 and Q6 are turned on. Thereby, an N-type sense amplifier drive signal and a P-type sense amplifier drive signal are generated on signal lines 41 and 51, respectively, and N-type and P-type sense amplifiers 2 and 3 are activated.

Due to the sensing operations of sense amplifiers 2 and 3, the signal potential difference between bit lines BL and /BL is further amplified. Specifically, the potential of bit line BL is raised to supply potential Vcc level, and the potential of bit line /BL is lowered to the ground potential level, i.e., low level. In the data reading operation, the amplifying operations of sense amplifiers 2 and 3 are performed for a restoring operation by which the read information is written in memory cell 1 again.

At time T6, the potential of selected word line WL and column selecting signal Yi move from the high level to the low level, so that transistors Q18 and Q19 are turned off, and amplifier 7 of the current mirror type is inactivated. Thereby, read only data lines RI and /RI are charged through transistors Q14 and Q15, respectively, and return to the predetermined stable potential (Vcc−|Vthp|).

At time T7, both sense amplifier activating signals S0 and /S0 go to the inactive state, and equalizing signal EQ rises to the high level, whereby bit lines BL and /BL are precharged and equalized, and one memory cycle is completed.

In a case that the selected memory cell 1 has information "0", stored information "0" of selected memory cell 1 is transmitted to bit line BL. In this case, the change of potential indicated by alternate long and short dash line in FIG. 8 is caused in bit line BL, so that the potential of read only data line RI is at the low level, and the potential of read only data line /RI is at the high level.

Now, the data writing operation will be briefly described below. Complementary internal data (e.g., DIN and /DIN) which is produced by a data writing circuit (not shown) in accordance with an external write data is transmitted to write only data line pair WI and /WI. In this writing operation, write instructing signal W has the high level and thus transistors Q12 and Q13 are in the on-state.

At time T5, the column decoder (not shown) generates column selecting signal Yi in accordance with the column selecting operation, and the selected bit line pair is connected to write only data line pair WI and /WI. Before time T5, the sensing operations of sense amplifiers 2 and 3 are completed, and the selected bit lines have the potentials corresponding to the internal write data transmitted to write only data lines WI and /WI.

In the waveform diagram of FIG. 8, column selecting signal Yi is shown to go to the high level at time T5 in the data writing operation. The shifting of the timing, at which column selecting signal Yi goes to the active state in the data writing operation and in the data reading operation, is implemented by the combination of write instructing signal W and column address strobe signal /CAS (which provides a timing for latching an external address signal as a column address). Specifically, when write instructing signal W indicates the data writing operation, column address strobe signal /CAS goes to the active state with a delay of a predetermined time, so that column selecting operation is delayed by the predetermined time in the data writing operation.

The provision of the independent and separate read only data lines and write only data lines enables the reading of the data immediately after the selection of the word lines in the data reading operation, and thus enables the data reading operation at the high speed.

However, read only data lines form the internal nodes of the amplifier of the current mirror type, and drive circuit 7b provided for each bit line pair is commonly connected thereto. Therefore, a large number of gate capacitances (including bit line capacitance) are connected to read only data lines, and thus the amplifier of the current mirror type has a large load capacitance.

The read data, which is supplied from node NO1 in FIG. 7, is obtained by discharging the read only data lines. However, the read only data lines, which are accompanied with the large gate capacitance as described above, cannot be discharged at the high speed. Therefore, there is caused a long delay time between the activation of the column selecting signal and the subsequent generation of sufficient potential amplitude in the read only data lines (i.e., amplitude between the high level data and the low level data), which unpreferably impedes the high speed reading of the data.

The gate capacitances accompanying to the read only data lines are charged and discharged by the current supplied from the load circuit (current mirror circuit). Therefore, as the gate capacitances increase, the current consumption of the amplifier of the current mirror type increases.

SUMMARY OF THE INVENTION

It is an object of the invention to provide a semiconductor memory device, in which data can be read at a higher speed and a current consumption of a data reading amplifier can be reduced.

In a semiconductor memory device according to a first aspect of the invention, read only data lines are divided into a first portion, to which a current supplying load circuit and output node of a data reading amplifier are connected, and a second portion, to which a drive circuit provided for each bit line pair is commonly connected, and a capacitance separating means is provided for electrically connecting the first and the second portions while separating capacitance of the first portion from capacitance of the second portion.

In a semiconductor memory device according to a second aspect of the invention, a memory cell array is divided into groups of columns, A read only data line has a hierarchical structure of a secondary read data line provided for each group of columns, and a primary read data line to which the secondary read data lines are commonly connected. Further means, which is responsive to a group selecting signal to electrically connect the secondary read data line corresponding to the selected group to the primary read data line while separating capacitance of the primary and secondary data read lines from each other, is disposed between respective secondary read data lines and the primary read data line.

To each secondary read data line is commonly connected each drive circuit of the corresponding column group. To the primary read data line is connected a current supplying load circuit and an output node of a read amplifier.

In the semiconductor memory device of the first aspect of the invention, the capacitance separating means separates the capacitances of the first portions and the second portion to reduce the load capacitance associated to the output node, whereby the output node is charged and discharged at a high speed, and thus the response speed in the data reading operation is improved. This capacitance separating means reduces a charged potential of the second portion by separating the capacitances, and thus charging and discharging currents of the read only data lines are reduced.

In the semiconductor memory device of the second aspect of the invention, the secondary read data line for one group of columns is connected to the primary read data line, but the capacitances of them are separated, so that the load capacitance formed at the output node is reduced, and thus the response speed is further increased. The capacitance separating means restricts the charged and discharged potentials of the secondary read data lines, and thus charging and discharging currents in the load circuit are reduced. The charging and discharging are carried out only in the secondary read data line which is provided for one group of columns, and thus the charging and discharging currents are further reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENT

Figure 1:
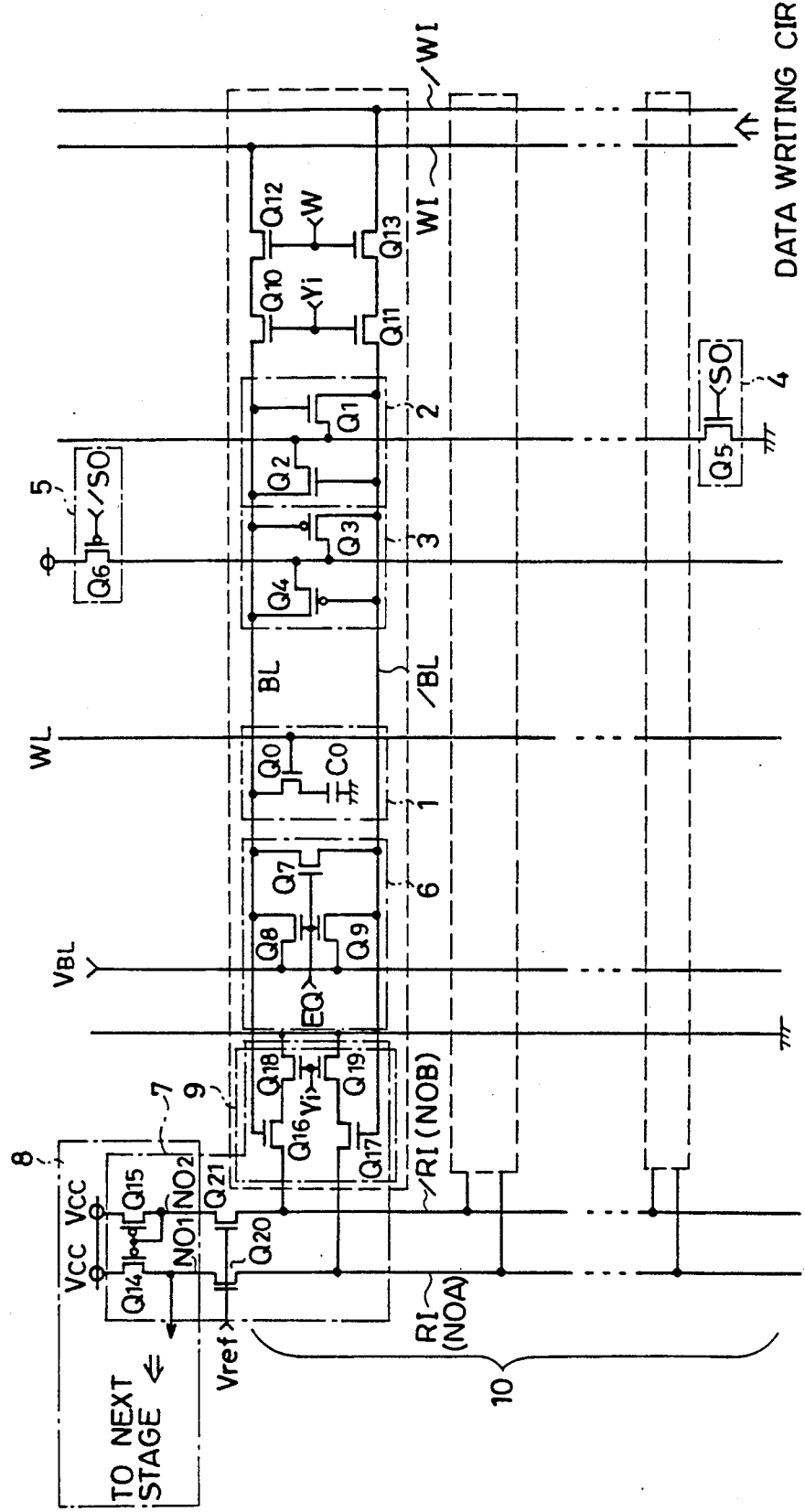
FIG. 1 schematically shows a construction of a main part of a semiconductor memory device of an embodiment of the invention.

Embodiments of the invention will be described below with reference to the figures, in which portions similar to or corresponding to those in the conventional semiconductor memory device shown in FIG. 7 bear the same reference numerals or characters, and will not be detailed hereinafter.

FIG. 1 schematically shows a construction of a main part of a semiconductor memory device according to an embodiment of the invention. FIG. 1 representatively shows a pair of bit lines BL and /BL.

In FIG. 1, read amplifier means, i.e., amplifier 7 of the current mirror type includes a current load circuit 8 for supplying current flows to read only data lines RI and /RI, and a drive circuit 9 which is provided for each bit line pair and amplifies the potentials of the associated bit lines. Current supplying load circuit 8 includes output node NO1 which transmits the data of a selected memory cell to an amplifier such as a preamplifier at a next stage. Each drive circuit 9 of the amplifier of the current mirror type is provided for each bit line pair, and is commonly connected to second portions 10 (codes NOA and NOB) of read only data lines RI and /RI. First portions of read only data lines RI and /RI are contained in load circuit 8.

The semiconductor memory device according to the invention further includes capacitance separating means disposed between the first and second portions of read only data lines RI and /RI for separating the capacitances, of them while electrically connecting them. This capacitance separating means includes an h-channel MOS transistor Q20 disposed between load transistor Q14 and drive transistor Q17 which are connected to read only data line RI, and an n-channel MOS transistor Q21 disposed between load transistor Q15 and drive transistor Q16 which are connected to read only data line /RI. Transistors Q20 and Q21 receive at the gates a reference potential Vref (a constant voltage), e.g., of Vcc/2 or Vcc/2−Vth.

Due to the provision of transistors Q20 and Q21, a pair of read only data lines RI and /RI is divided into first and second portions. In the following description, the first and second portions are represented by nodes. Data line RI includes two nodes, i.e., a node NO1 located between transistor Q20 and load transistor Q14 which are connected to read only data line RI, and a node NOA located at a side of transistor Q17 with respect to transistor Q20.

Similarly, read only data line /RI is divided by transistor Q21 connected to read only data line /RI into two nodes, i.e., node N02 located at a side of load transistor Q15 and node NOB located at a side of drive transistor Q16 with respect to transistor Q21.

Transistors Q20 and Q21 are located extremely close to nodes NO1 and N02 of read only data lines RI and /RI, respectively. That is, nodes NO1 and N02, which are formed by the provision of transistors Q20 and Q21, are located extremely close to load transistors Q14 and Q15 included in load circuit 8 which is a part of amplifier 7 of the current mirror type.

Figure 2:
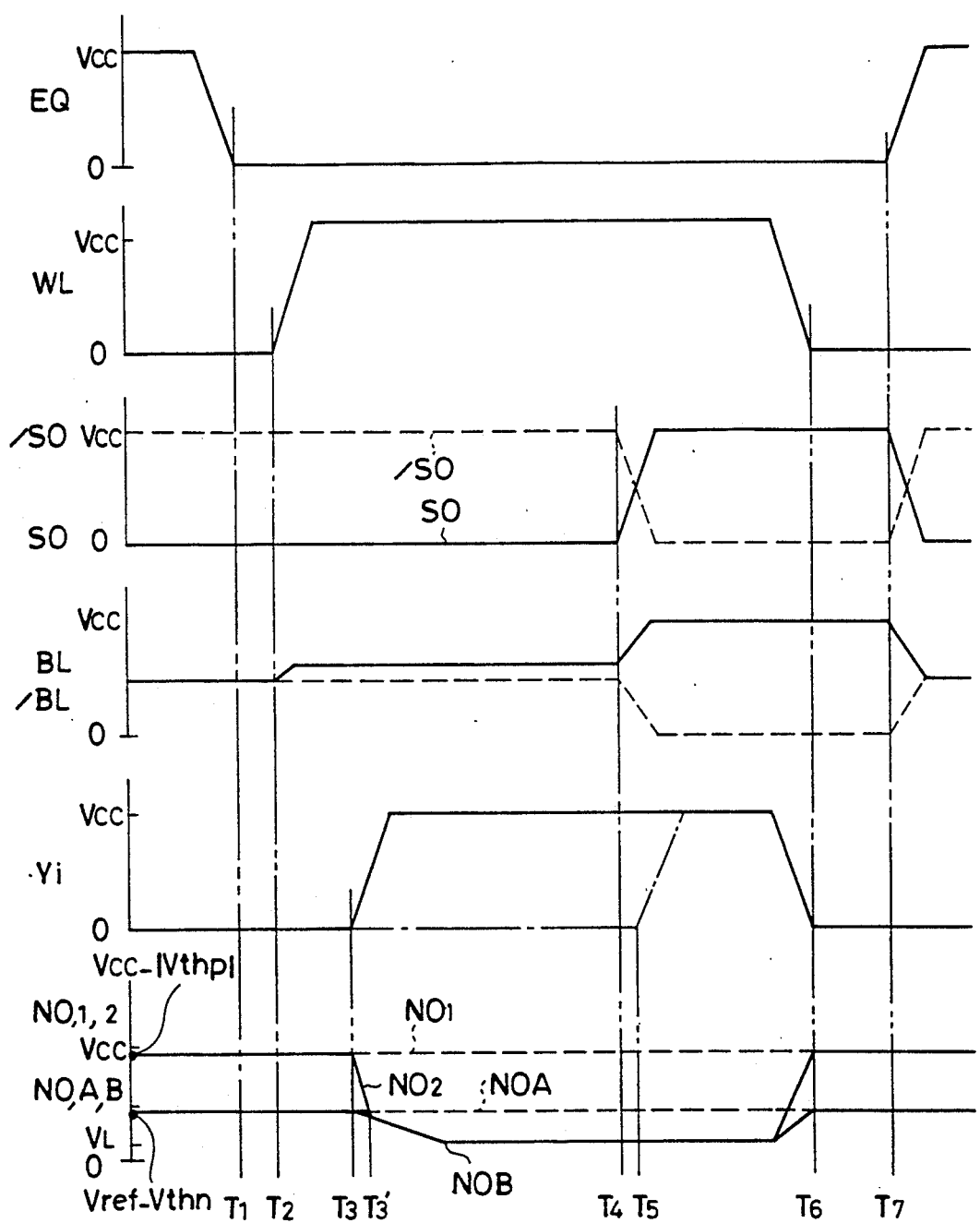
FIG. 2 is a signal waveform diagram showing a typical circuit operation of a semiconductor memory device of the invention.

In other words, in the read only data line RI, an interconnection length between transistor Q20 and load transistor Q14 is minimized, and similarly, the interconnection length between transistor Q21 and load transistor Q15 is minimized in read only data line /RI. Node NO1 provides a signal output node and is connected, e.g., to an input of an amplifier at the next stage. Then, the operation of the semiconductor memory device shown in FIG. 1 will be described below with reference to FIG. 2, which is a signal waveform diagram showing the reading operation. In FIG. 2, the same reference characters as those in FIG. 1 indicate the signal potentials of the corresponding portions.

FIG. 2 shows the signal waveforms, which appears in a case that the information "1" has been stored in memory cell 1 and is read therefrom.

Figure 7:
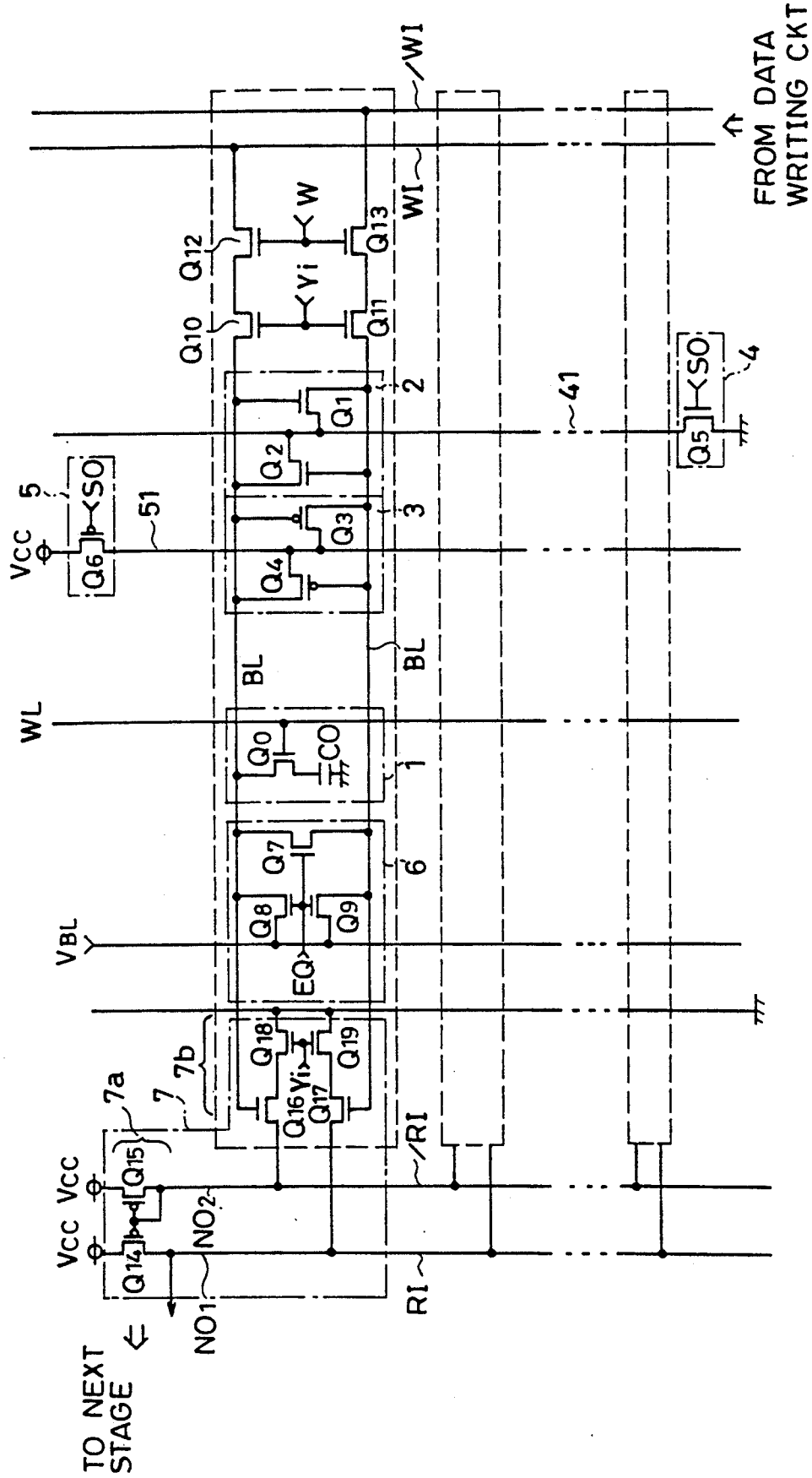
FIG. 7 shows a construction of a main part of a conventional semiconductor memory device.
Figure 8:
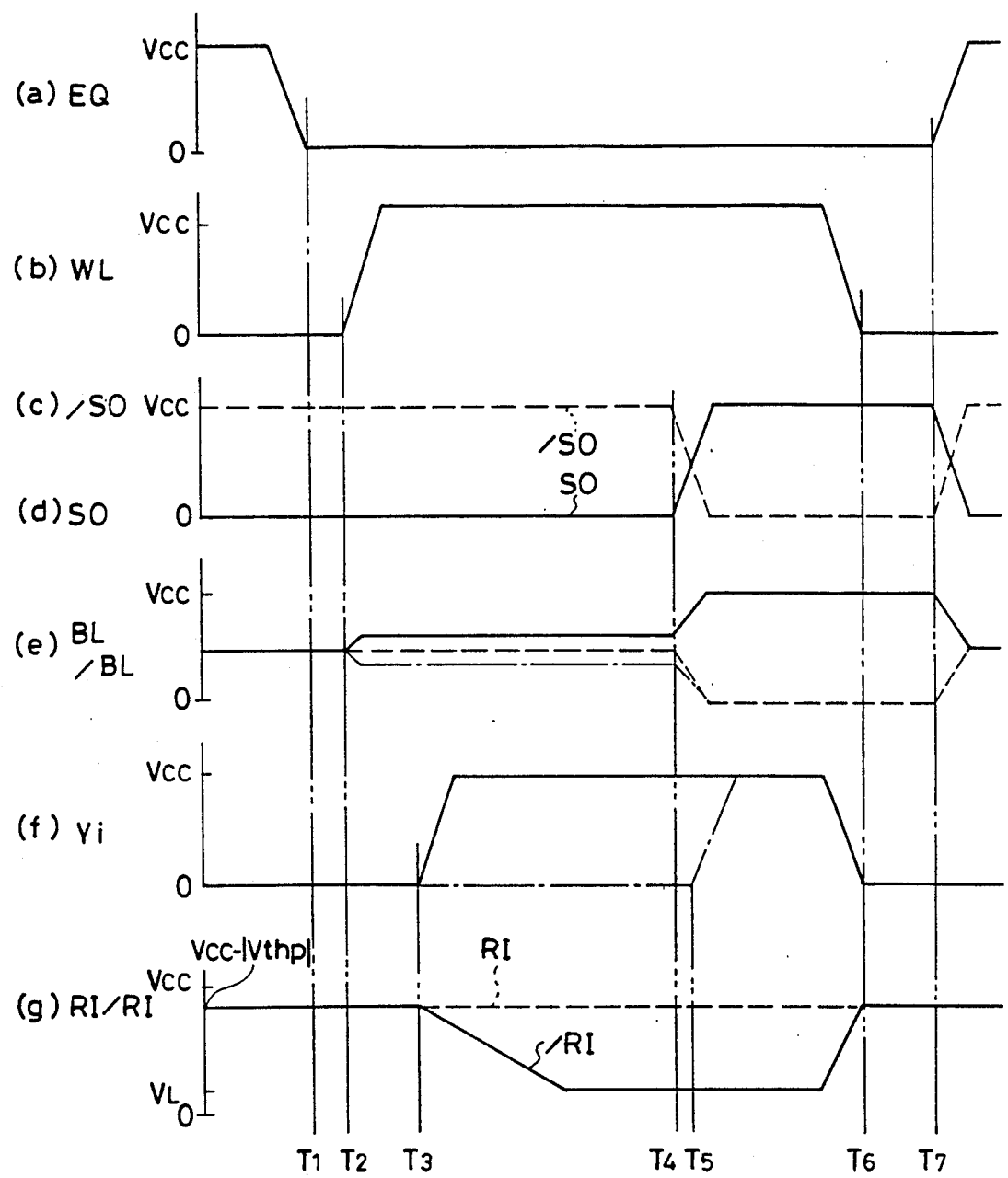
FIG. 8 is a signal waveform diagram showing a representative circuit operation of a semiconductor memory device shown in FIG. 7.

The operations from the start of the reading operation to time T3 are similar to those of the conventional semiconductor memory device shown in FIGS. 7 and 8.

Before time T3, the potentials of nodes NO1 and N02 are stable at a voltage of Vcc−|Vthp| which is lower than supply potential Vcc by an absolute value of the threshold voltage Vthp of load transistors Q14 and Q15.

The potentials of nodes NOA and NOB are stable at the potential of Vref−Vthn which is lower than the gate voltage Vref of transistors Q20 and Q21 by threshold voltage Vthn of transistors Q20 and Q21.

At time T3, a column decoder (not shown) generates the column selecting signal Yi in response to an external address signal. When column selecting signal Yi rises from the low level to the high level, transistors Q18 and Q19 are turned on, and amplifier 7 of the current mirror type formed of transistors Q14-Q19 is activated. Thus, the potential of each of nodes NOB and N02 on read only data line /RI is discharged toward the ground potential in order to amplify a minute potential difference appearing between bit lines BL and /BL. In this operation, the potential of node NOB is discharged at a slow speed due to the delay by the charged charges of the gate capacitance, because the gate capacitance connected to read only data line /RI is large, similarly to the conventional semiconductor memory device.

Owing to the provision of transistor Q21, node N02 is separated from the gate capacitance connected to the node NOB, and thus the delay of the response, which may be caused by the charged charges of the gate capacitance can be avoided. Thus, potential of node N02 rapidly falls. Particularly, since the potential of node N02 is Vcc−|Vthp| and the precharged potential of node NOB is Vref−Vthn and the potential of node N02 is higher than the potential of node NOB, the potential of node N02 falls toward the potential of node NOB at a high speed. The potential of node N02 is fed back to the gate of load transistor Q14.

Node NO1 is connected, e.g., to the input of a downstream amplifier. If the stored information of the selected memory cell 1 is "1", the potential of node NO1 is stable at Vcc−|Vthp|. If the selected memory cell has stored information "0", the potential of node NO1 falls at a high speed. Therefore, the response speed at node NO1 increases, and thus the data having a sufficient amplitude (with respect to high/low criterion) can be transmitted at the high speed, e.g., to the input of the amplifier at the next stage, which is very effective for the high speed reading of the data.

At time T3', node N02 has the same potential as the node NOB. In this case, the discharging speed of node N02 through transistor Q21 is rate-determined by the discharging speed of node NOB, and the potential of node N02 lowers at the same speed as that of node NOB. The potentials of nodes N02 and NOB lower to a predetermined intermediate potential VL. The intermediate potential VL determining the low level is determined by a current supplying ability of load transistor Q15 and a discharging ability of the discharging path formed of transistors Q16 and Q18.

At time T3', at which the potential of node N02 becomes equal to that of node NOB, i.e., at which nodes N02 and NOB have the same potential lowering speed, a sufficient potential difference has already been developed between the nodes N01 and N02. This potential difference provides a magnitude enough for ensuring the high speed amplifying operation of the amplifier at the next stage.

Operations at and after time T4 are similar to those shown in the operation waveform diagram of the conventional semiconductor memory device shown in FIG. 8.

The operation of transistors Q20 and Q21 will be described below in detail.

Figure 3:
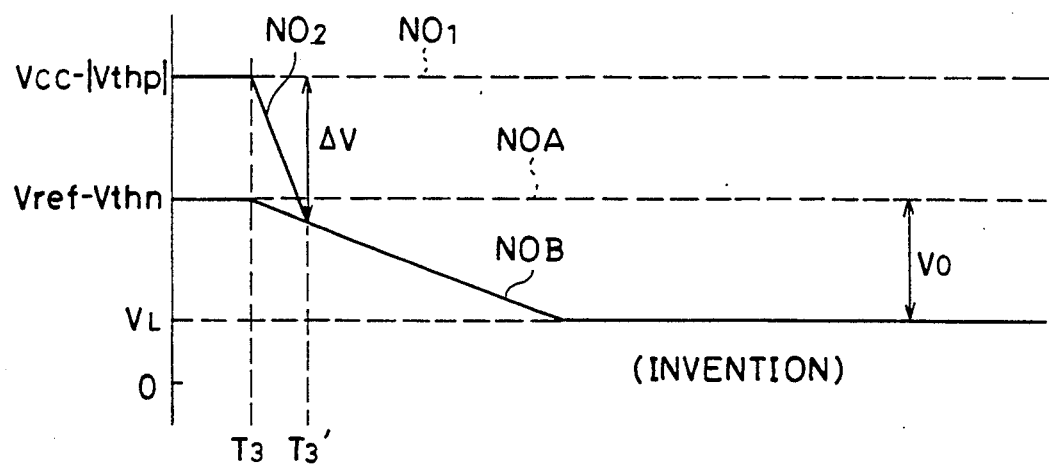
FIGS. 3(a)–(b) are a signal waveform diagram for showing an effect of a semiconductor memory device of the invention.
Figure 3:
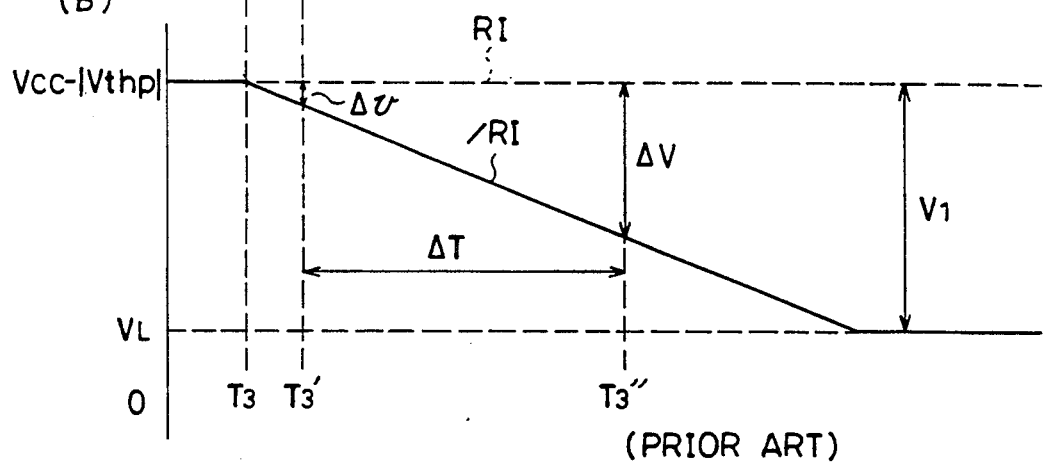

FIG. 3 is an enlarged diagram showing a part of the signal waveform at the proximity of time T3 shown in FIG. 2. FIG. 3(A) shows the change of the potential of the output node in the semiconductor memory device of the invention, and FIG. 3(B) shows the change of the potential of the output node in the conventional semiconductor memory device. In the following description, the operating power supply potential is indicated by Vcc, the threshold voltages of p-channel MOS transistors corresponding to load transistors Q14 and Q15 are indicated by Vthp, the threshold voltages of n-channel MOS transistors corresponding to capacitance separating transistors Q20 and Q21 are indicated by Vthn, and the voltages applied to the gates of transistors Q20 and Q21 are indicated by Vref.

Before time T3, nodes N02 and NOB are stable at predetermined stable potentials. That is, node N02 is stable at Vcc−|Vthp|, and node NOB is stable at Vref−Vthp.

At time T3, amplifier 7 of the current mirror type is activated, whereby, as shown in FIG. 3(A), the potentials of nodes N02 and NOB in the semiconductor memory device of the embodiment lower to the ground potential.

Similarly, the potential of node R1 (N02=NOB; read only data line) of the conventional semiconductor memory device shown in FIG. 3(B) also lowers to the ground potential. The potential of node N02 in the semiconductor memory device of the embodiment lowers at the high speed for the reason described before, and, at time T3', the potential of node N02 lowers by ΔV.

Meanwhile, in the conventional semiconductor memory device shown in FIG. 3(B), only a potential difference of Δv is generated at time T3, due to its large gate capacitance. In the conventional semiconductor memory device, the potential difference of ΔV generates in node /RI at time T341, i.e., after the elapsing of a time period ΔT from time T3'. Thus, the semiconductor memory device of the embodiment of the invention improves the response speed by time period ΔT as compared with the conventional device. The voltage drop of ΔV generating at node N02 is the potential difference which ensures a sufficient amplifying sensitivity of the amplifier at the next stage (i.e., it is the potential difference which ensures the amplification of data "1" and "0" without malfunction).

In the semiconductor memory device of the embodiment, nodes N02 and NOB have the equal potential at time T3', Thereafter, the potential drop of node N02 is rate determined by the lowering speed of the potential of node NOB, and the potentials of both nodes lower at the same voltage lowering speed to the predetermined intermediate potential VL.

In the embodiment shown in FIG. 3(A), a potential amplitude VD at node NOB is smaller than a potential amplitude Vl of read only data line /RI shown in FIG. 3(B).

To nodes NOA and NOB in the embodiment, there are connected many gate capacitances similarly to read only data lines RI and /RI of the conventional device. In the embodiment, the provision of transistors Q20 and Q21 enables the reduction of the high level (precharge level) of the read only data lines from Vcc−|Vthp| to Vref−Vthn. That is, logical amplitudes at the second portions (nodes NOA and NOB) of read only data lines can be restricted from the value of Vl to the value of V0. The restriction of the logical amplitudes enables the reduction of the charging and discharging currents (charging currents in the precharging operation and discharging currents in the data reading operation) of the gate capacitances associated with to nodes NOA and NOB, resulting in the amplifier of the current mirror type which operates with the low current consumption.

Figure 4:
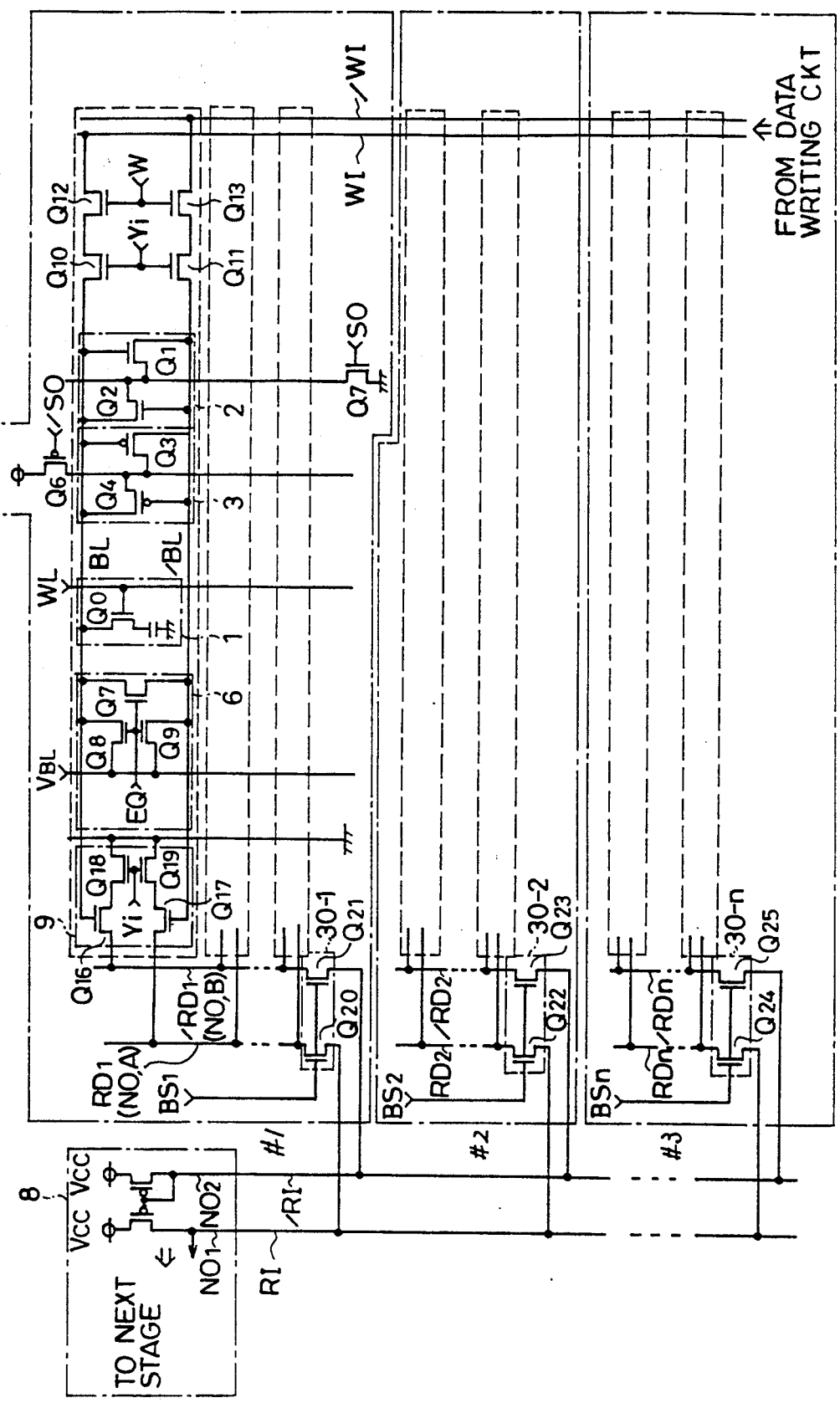
FIG. 4 schematically shows a construction of a main part of a semiconductor memory device of another embodiment of the invention.

FIG. 4 schematically shows a construction of a main part of a semiconductor memory device according to another embodiment of the invention. In FIG. 4, portions corresponding to those of the semiconductor memory device shown in FIG. 1 bear the same reference numerals.

In FIG. 4, the memory cell array is divided into column groups, i.e., blocks #1, #2, ..., #n, each including a plurality of columns. A pair of secondary read data lines RDk and /RDk (k =1, 2, ..., n) is provided for each column group. Each pair of read only secondary data lines RDk and /RDk is provided with a group selecting and connecting circuit 30-k, which is responsive to a block selecting signal (column group selecting signal BSk) to connect corresponding read only secondary data line pair RDk and /RDk to read only primary data line pair RI and /RI. Each connecting circuit 30-k includes n-channel MOS transistors (Q20, Q22, ..., Q24), which are disposed between read only secondary data line RDk and read only primary data line RI, and n-channel MOS transistors (Q21, Q23, ..., Q25) disposed between secondary data line /RDk and primary data line /R.

The high level of the block selecting signal BSk is an intermediate potential Vref, and its low level is the ground potential of 0V. Since the potential swing of block selecting signal BSk is from Vref to 0V, the transistors contained in connecting circuits 30-l–30-n perform the functions similar to capacitance separating transistors Q20 and Q21 shown in FIG. 1.

In the above construction, the read only data lines are divided into read only primary data line pair RI and /RI providing the first portions, and read only secondary data line pair RDk and /RDk providing the second portions. Since only the secondary data line pair connected to a selected one column group is connected to primary data line pair RI and /RI, the amplifier of the current mirror type (formed of load circuit 8 and drive circuit 9) can be operated with the low current consumption. Also, secondary data line pair is accompanied with only the gate capacitance of the one column group. Therefore, the secondary data line pair can be charged and discharged at a higher speed than the conventional device, and thus the high speed operation can be achieved.

The connecting circuit formed of the transistors for restricting the logical swing, which also serves as the block selecting switch, is disposed between read only primary data line pair RI and /RI and read only secondary data line pair RDk and /RDk, as described above. This enables the operation of the amplifier of the current mirror type at a higher speed with the low current consumption.

Figure 5:
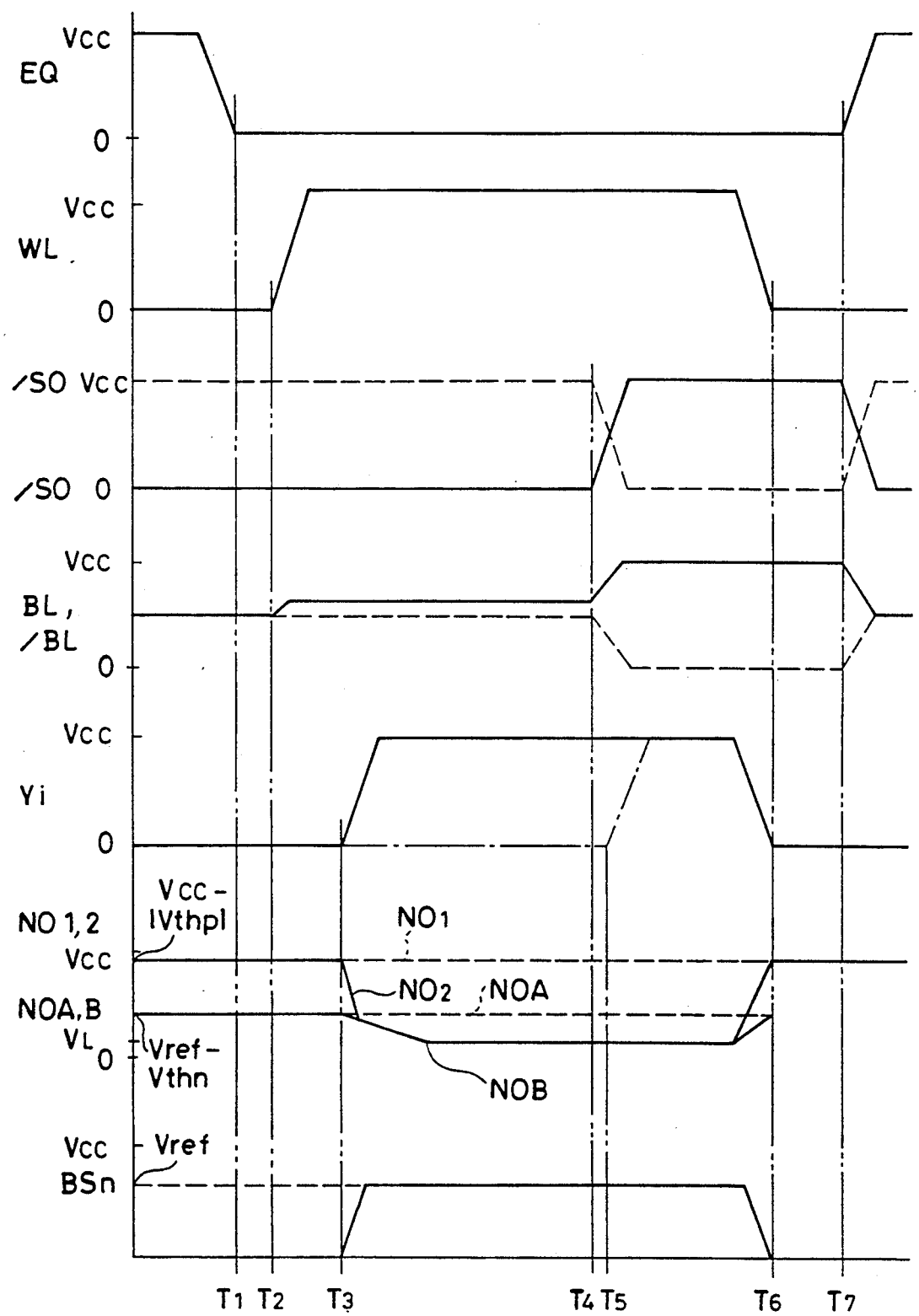
FIG. 5 is a signal waveform diagram showing a representative circuit operation of a semiconductor memory device shown in FIG. 4.

FIG. 5 is a signal waveform diagram showing a representative operation of the semiconductor memory device shown in FIG. 4. In FIG. 5, signal waveforms corresponding to those of the signals shown in FIG. 4 bear the same characters. Next, the operation of the semiconductor memory device shown in FIG. 4 will be briefly described below with reference to FIGS. 4 and 5.

The operations at time T1 through time T3 are similar to those of the semiconductor memory device shown in FIGS. 1 and 2.

It is assumed that block #1 is selected at time T3. A block selecting signal BS1 is applied to the gates of transistors Q20 and Q21 included in connecting circuit 30-1 1 provided in block #1. Thus, reference voltage Vref is applied to gates of transistors Q20 and Q21.

Simultaneously, i.e., at time T3, column selecting signal Yi is applied to the gates of transistors Q18 and Q19 in the drive circuit. At time T3, amplifier 7 of the current mirror type, therefore, is immediately activated to amplify the potential difference generated between bit lines BL and /BL.

In this operation, similarly to the semiconductor memory device shown in FIG. 1, the operation is carried out with read only secondary data line pair RD1 and /RD1 (or corresponding read only secondary data line pair if another block is selected), such that transistors Q20 and Q21 contained in selecting and connecting circuit 30-1 divide read only data lines into two nodes, i.e., read only primary data line pair portion (i.e., nodes NO1 and NO2) and read only secondary data line pair portion (i.e., nodes NOA and NOB), similarly to the semiconductor memory device shown in FIG. 1. Thereby, the potential of node NO1 or NO2 rapidly lowers from the high level of Vcc−|Vthp| to the predetermined intermediate potential VL. Meanwhile, the potentials of nodes NOA and NOB are restricted to have the logical swing from the precharge potential Vref−Vthn to the intermediate potential VL. Thereby, the response speed for the data output to the next stage is increased, and the reading operation with the low current consumption is achieved, similarly to the semiconductor memory device shown in FIG. 1.

At time T6, column selecting signal Yi lowers from the high level to the low level, the amplifier of the current mirror type (load circuit 8 and drive circuit 9) is inactivated, and block selecting signal BS1 lowers from the high level (Vref) to the low level. Thereby, block #1 goes to the unselected state. In the signal waveform diagram shown in FIG. 5, block selecting signal BS1 is generated in synchronization with column selecting signal Yi. However, the falling timing of the block selecting signal BS1 may be delayed from the lowering timing of column selecting signal Yi in order to surely precharge read only secondary data lines RD1 and /RD1 to the predetermined potential after inactivating the drive circuit 9.

Alternatively, each secondary read data line pair may be provided with precharging/equalizing means for receiving the reference potential Vref as the precharging/equalizing signal, which is similar to the capacitance separating transistors shown in FIG. 1.

The operations after time T6 are similar to those of the semiconductor memory device shown in FIGS. 1 and 2.

Block selecting signal BSk is generated, utilizing lower order bits of the column address, of which number is determined corresponding to the number of the column groups of the memory cell array.

In the constructions of the semiconductor memory devices shown in FIGS. 1 and 4, input and output of the data are performed in a one-bit unit. Output and input of the data of multiple bits can be implemented by providing the memory cell array in multiple planes.

FIG. 6 shows a construction of a main part of a semiconductor memory device according to still another embodiment of the invention. The construction shown in FIG. 6 provides a modification of load circuit 8 in the amplifier 7 of the current mirror type. In load circuits 8 in the amplifier of the current mirror type shown in FIGS. 1 and 4, the gate of one of the load transistors is connected to the one conduction terminal thereof. In this construction, output nodes NO1 and NO2 are accompanied with different gate capacitances. That is, output node NO1 is accompanied with the gate capacitance of transistor Q14, and node NO2 is accompanied with the gate capacitance of transistor Q15 as well as the gate capacitance of transistor Q14. Therefore, it is difficult for nodes NO1 and NO2 to have the same characteristic for the change to the high or low level. Accordingly, in the constructions shown in FIGS. 1 and 4, the read data is taken out only from one node NO1. It is desirable to generate complementary internal data for surely reading the data. The construction shown in FIG. 6 provides a structure for surely generating such complementary internal data.

Figure 6A:
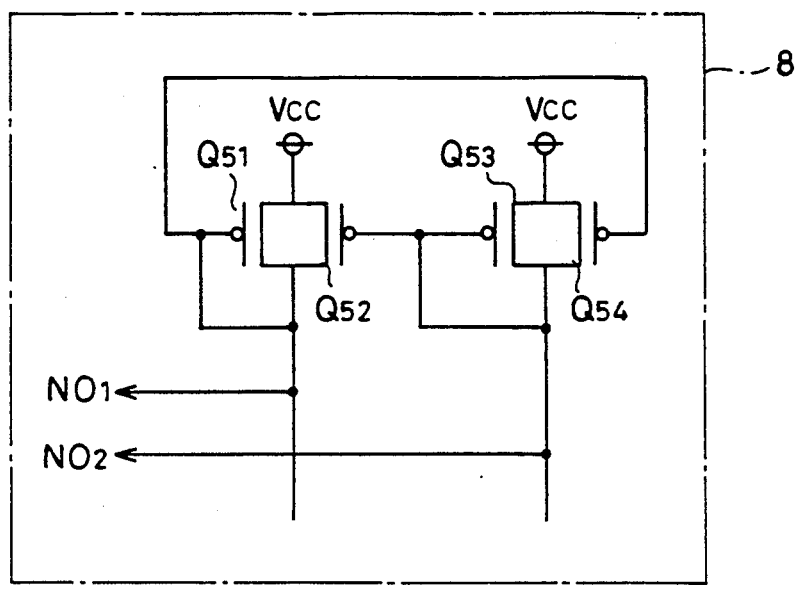
FIGS. 6(a)–(b) show a construction of a main part of a semiconductor memory device according to still another embodiment of the invention, and particularly shows a modification of a load circuit of an amplifier of a current mirror type.

In FIG. 6A, load circuit 8 in amplifier 7 of the current mirror type includes p-channel MOS transistors Q51 and Q52 connected in parallel between node NO1 and supply potential Vcc, and p-channel MOS transistors Q53 and Q54 connected in parallel between node NO2 and supply voltage Vcc. Transistor Q51 has a gate connected to node NO1 and to a gate of transistor Q54. Transistor Q53 has a gate connected to a gate of transistor Q52 and to node NO2. Load circuit 8 has a symmetrical structure, in which nodes NO1 and NO2 are accompanied with the same parasitic capacitance, and thus the complementary internal data can be surely produced. Then, the operation thereof will be described below.

Figure 6B:
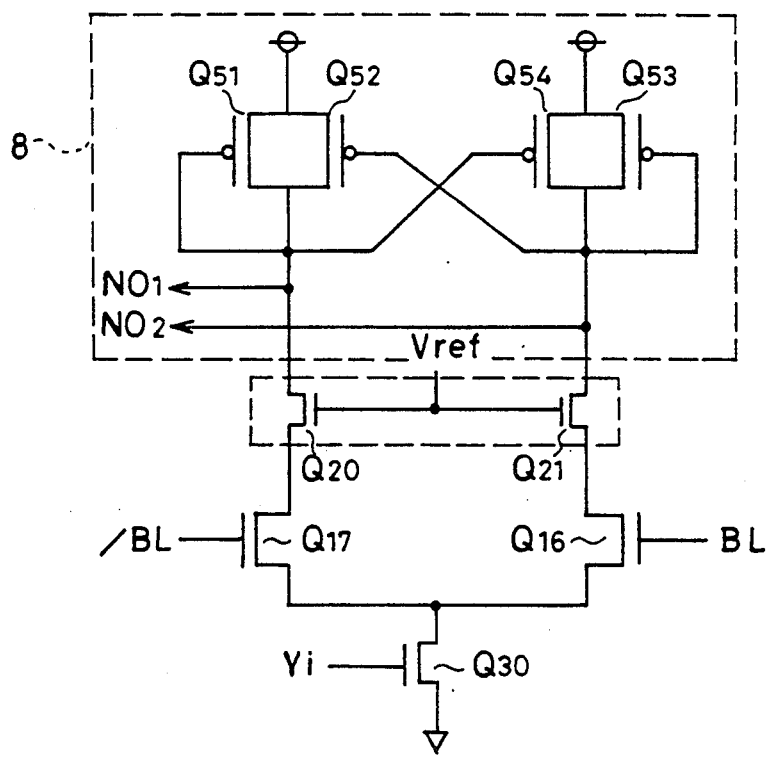

FIG. 6B shows the load circuit in a manner different from that shown in FIG. 6A. As can be seen from FIG. 6B, positions of transistors Q53 and Q54 are replaced with each other, and transistors Q52 and Q54 are clearly shown forming a cross-coupled latch circuit of a flip-flop type. Transistors Q51 and Q53 function as diodes to set the potentials of nodes NO1 and NO2 at Vcc−|Vthp|, respectively. The operation of load circuit 8 will be described below with reference to FIG. 6B.

In the following description, it is assumed that information "1", i.e., potential "H" is transmitted to bit line BL. Upon reading of information "1" to bit line BL, column selecting signal Yi rises from the low level to the high level, whereby a transistor Q30 is turned on, and the amplifier of the current mirror type is activated.

Owing to reading of information "1" onto bit line BL, transistor Q16 receiving at its gate the potential of bit line BL is turned on slightly more strongly than transistor Q17 having a gate receiving the potential of bit line /BL (i.e., the conductance of Q16 increases). Thereby, the reduction of the potential through transistor Q30 toward the ground potential is performed in node N02 to an extent larger than that in node NO1. That is, the potential of node N02 lowers more rapidly than that of node NO1. Responsively, p-channel MOS transistor Q52 having the gate receiving the potential of node N02 is turned on more strongly than transistor Q54 having the gate receiving the potential of node NO1. In this operation, node NO1 is pulled up more strongly than node N02 to supply potential Vcc. In this manner, the potentials of nodes NO1 and N02 have the following relationship:

potential of node NO1 > potential of node NO The potentials of nodes NO1 and NO2 are applied to the gates of transistors Q54 and Q52, respectively. Thereby, the change of the potentials of nodes NO1 and NO2 is fed back, so that transistor Q54 goes to the off-state and transistor Q52 goes to the on-state. Owing to the foregoing operations, the potential of node NO1 goes to the high level, and the potential of node NO2 goes to the low level. The minute potential difference between bit line BL and bit line /BL is amplified at a high speed in nodes NO1 and NO2. The potentials of nodes NO1 and NO2 are transmitted to the next stage as internal read data.

Transistors Q52 and Q54 form a latch circuit latching the potentials of nodes NO1 and NO2. When column selecting signal Yi falls to the low level and the amplifying operation of the amplifier of the current mirror type terminates, the potentials of nodes NO1 and NO2 are equalized. If transistors Q51 and Q53 are not provided, the potentials of nodes NO1 and NO2 remain at the potentials corresponding to the read potentials due to the latching operation of transistors Q52 and Q54, and cannot return to the predetermined precharge potential.

Diode-coupled transistors Q51 and Q53 are provided in order to release the latching of transistors Q52 and Q54. That is, transistor Q51 carries out the operation opposite to that of transistor Q52, and transistor Q53 carries out the operation opposite to that of transistor Q54. For example, when the potential of node NO1 rises, transistor Q52 is turned on and transistor Q51 is turned off. Also, transistor Q54 is turned off and transistor Q53 is turned on. In this manner, a gain of the amplifying circuit formed by the latch circuit is positively lowered. That is, the potential amplitudes of nodes NO1 and NO2 are not fully swung (i.e., do not change between $Vcc-|Vthp|$ and VL).

In this case, an adverse influence onto the operation of the amplifier of the current mirror type can be prevented by setting the current supply abilities of transistors Q51 and Q53 to be smaller than those of transistors Q52 and Q54, respectively. Transistors Q51 and Q53 also serve to reduce the latching ability of transistors Q52 and Q54. When transistors Q52 is turned off and the potential of NO1 lowers, transistor Q51 is turned on to increases the potential of node NO1. Accordingly, the low level of node NO1 is set at the potential, which is predetermined by the relationship between the current supplying ability of transistor Q51 and the discharging abilities of the corresponding discharging transistors Q17 and Q30.

When column selecting signal Yi goes to the low level and the discharging path in load circuit 8 is cut off, nodes NO1 and NO2 are charged by transistors Q51 and Q53, respectively. The changes of the potentials of nodes NO1 and NO2 are compensated for by transistors Q51–Q54, and thus the potentials of nodes NO1 and NO2 are surely equalized to the predetermined precharge potential $Vcc-|Vthp|$.

In the load circuit having the construction shown in FIG. 6, nodes NO1 and NO2 are accompanied with the equal parasitic capacitances, because of the symmetrical layout of transistors Q51–Q54, so that nodes NO1 and NO2 can have the same potential changing characteristics. This enables the output of the complementary internal read data.

In the construction shown in FIGS. 1, 4 and 6, the drive circuit is connected to nodes NOA and NOB through the transistors which receive the bit line potentials at their gates, and is connected to the ground potential through the transistors which receive the column selecting signal. In this case, such a construction may be employed that transistors, which operate in response to the column selecting signal, are connected to nodes NOA and NOB, and transistors for amplifying the bit line potentials are disposed between the column selecting transistors and the ground potential.

Also, the transistors in the amplifying circuit of the current mirror type may be of the opposite conductivity types to those shown in the figures.

According to the first and second aspects of the invention, as described hereinbefore, read only data line pair is divided into the first and second portions, only the output node and the load circuit are connected to the first portion, and the capacitance separating means for separating the capacitance is disposed between the first and second portions, whereby the output nodes can be accompanied with the remarkably reduced parasitic capacitances. Therefore, the data reading speed can be remarkably improved in the semiconductor memory device of the separated IO type, in which the data reading path and writing path are independently and separately provided.

The remarkable reduction of the gate capacitance connected to the output node enables the reduction of the charging and discharging currents for the gate capacitance, resulting in the semiconductor memory device of the low current consumption.

The capacitance separating means can restrict the logical swing at the second portions of the read only data lines, and the second portions can be accompanied with the gate capacitances of which charging and discharging currents are reduced, resulting in the further reduced current consumption.

By dividing the memory cell array into the column groups, the second portions can be accompanied with further reduced gate capacitances, and thus the semiconductor memory device can operate at the higher speed with the lower current consumption.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
   memory cell array having a plurality of memory cells arranged in a matrix of rows and columns;
   a write only data bus for data to be written into a selected memory cell in said memory cell array;
   a read only data bus for data to be read out from a selected memory cell in said memory cell array, said read only data bus being provided separately from said write only data bus;

read amplifying means for amplifying and transmitting the data read out from the selected memory cell to said read only data bus in a data reading mode of operation, said read amplifying means including a load means for supplying a current flow to said read only data bus, and a drive means responsive to the data read out from said selected memory cell for driving the read only data bus to a potential corresponding to the data read out from the selected memory cell; and means electrically interconnecting said load means and said drive means for separating capacitance of first circuitry including said drive means from capacitance of second circuitry including said load means.

2. A semiconductor memory device according to claim 1, wherein said means for separating is placed very close to said load means, and said second circuitry includes an output node placed between said load means and said means for separating.

3. A semiconductor memory device according to claim 1, wherein said second circuitry includes an output node for transferring data amplified by said read amplifying means to a subsequent stage, said data amplified having one of first and second potential levels, and said means for separating includes an insulated gate type transistor element inserted between said load means and drive means and having a gate receiving a predetermined potential level which in turn is between said first and second potential levels.

4. A semiconductor memory device according to claim 1, wherein said memory cell array further includes a plurality of pairs of bit lines, one pair for each said column of memory cells, and wherein said read only data bus includes a pair of data lines, and said drive means includes discharging means provided for each said pair of bit lines and responsive to a column select signal and potentials on an associated pair of bit lines for discharging one of the data lines.

5. A semiconductor memory device according to the claim 1, wherein said memory array is divided into a plurality of groups of columns, and said read data bus includes a main data bus providing said first node, and a plurality of sub data buses provided for each said group of columns and each providing said second node, and said means for separating includes a plurality of connection means one provided for each said group of columns and responsive to a column group selection signal for connecting said main data bus and an associated sub data bus, said column group selection signal having an active level at which said connection means separates capacitance of said main data bus from capacitance of said associated sub data bus.

6. A semiconductor memory device according to claim 5, wherein said connecting means includes an insulated gate type transistor having a gate receiving said column group selection signal which in turn is at a level between an operating power supply potential and a ground potential.

7. A semiconductor memory device, comprising:
a memory cell array including a plurality of memory cells arranged in a matrix of rows and columns;
a plurality of pairs of bit lines provided corresponding to to said columns, each said pair of bit lines connecting memory cells arranged in corresponding column;
a pair of write data lines for data to be written into a selected memory cell in said memory cell array;
a pair of read data lines, provided separately from said pair of write data lines, for data read from a selected memory cell in said memory cell array;
loading means for supplying a current flow to said pair of read data lines;
driving means provided for each said pair of bit lines and responsive to a column selection signal and potentials on an associated pair of bit lines for discharging one of the pair of read data lines to a ground level;
an output node coupled to said loading means for transferring data to a subsequent stage; and
a pair of insulated gate type transistors inserted between said loading means and said driving means to separate capacitance of said loading means from capacitance of said driving means and having a gate receiving a predetermined reference potential which in turn is at a level between an operating power supply potential and said ground potential.

8. A semiconductor memory device according to claim 7, wherein said pair of insulated gate type transistors is placed in close proximity of said load means.

9. A semiconductor memory device, comprising:
a memory cell array including a plurality of memory cells arranged in a matrix of rows and columns, said memory cell array being divided into a plurality of groups of columns;
a plurality of pairs of bits lines provided corresponding to said columns of the memory cell array and each connecting memory cells on a corresponding column;
a pair of write data lined provided commonly to said groups of columns for data to be written into a selected memory cell in said memory cell array;
a pair of first read data lines provided separately from said pair of the write data lines and commonly to said groups of columns;
loading means for supplying a current flow to said pair of the first read data lines;
a plurality of second read data lines provided corresponding to said groups of columns;
driving means provided for each said pair of the bit lines and responsive to a column select signal and potentials on an associated pair of bit lines for discharging one of an associated pair of the second read data lines to a ground potential level; and
a plurality of insulated gate type transistors provided between said loading means and said driving means to separate capacitance of sad loading means from capacitance of said driving means for each said group of columns and responsive to a group selection signal for connecting said pair of the first read data lines and associated pair of the second read data lines, said group selection signal having an intermediate potential level between a operating power supply potential and the group potential.

10. A semiconductor memory device, comprising:
memory cell array having a plurality of memory cells arranged in rows and columns;
a plurality of pairs of bit lines provided corresponding to said columns, each said pair of bit lines connecting memory cells arranged in a corresponding column;
a plurality of driving means provided for respective columns, each said driving means having a pair of output nodes and a pair of input nodes coupled to bit lines of a corresponding pair of bit lines for amplifying a potential difference between the corresponding pair of bit lines;

a pair of read data line connecting output nodes of said plurality of driving means;

load means for supplying a current flow to said pair of output nodes of driving means; and a pair of transistor elements provided between said output nodes of said load means and said pair of read data lines and each having a control electrode receiving a predetermined intermediate voltage between an operating power supply voltage and a ground potential, wherein said pair of transistor elements separate capacitance of said load means from capacitance of said driving means.

11. The device of claim 10, wherein said driving means includes means for discharging the read data lines to the ground potential.

* * * * *